United States Patent
Chang et al.

(10) Patent No.: US 11,018,019 B2
(45) Date of Patent: May 25, 2021

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/697,955

(22) Filed: Nov. 27, 2019

(65) Prior Publication Data

US 2020/0098585 A1 Mar. 26, 2020

Related U.S. Application Data

(60) Continuation of application No. 16/049,902, filed on Jul. 31, 2018, now Pat. No. 10,546,754, which is a division of application No. 15/048,942, filed on Feb. 19, 2016, now Pat. No. 10,163,649.

(60) Provisional application No. 62/269,025, filed on Dec. 17, 2015.

(51) Int. Cl.
| | |
|---|---|
| *H01L 21/311* | (2006.01) |
| *H01L 27/088* | (2006.01) |
| *H01L 27/02* | (2006.01) |
| *H01L 29/08* | (2006.01) |
| *H01L 21/768* | (2006.01) |

(52) U.S. Cl.
CPC .. *H01L 21/31111* (2013.01); *H01L 21/76831* (2013.01); *H01L 21/76897* (2013.01); *H01L 27/0207* (2013.01); *H01L 27/088* (2013.01); *H01L 29/0847* (2013.01)

(58) Field of Classification Search
CPC ......... H01L 21/31111; H01L 21/76802; H01L 21/76831; H01L 21/76834; H01L 21/76877; H01L 27/0207; H01L 27/088; H01L 29/0847
See application file for complete search history.

(56) References Cited

U.S. PATENT DOCUMENTS

| | | | |
|---|---|---|---|
| 8,853,810 B2 | 10/2014 | Baars et al. | |
| 9,391,204 B1 | 7/2016 | Cheng et al. | |
| 9,502,308 B1 | 11/2016 | Park et al. | |
| 2002/0140101 A1 | 10/2002 | Yang et al. | |

(Continued)

FOREIGN PATENT DOCUMENTS

| | | |
|---|---|---|
| CN | 1575515 A | 2/2005 |
| CN | 103811346 A | 5/2014 |
| CN | 105097470 A | 11/2015 |

*Primary Examiner* — Peter Bradford
(74) *Attorney, Agent, or Firm* — Slater Matsil, LLP

(57) ABSTRACT

A semiconductor structure includes a substrate, at least one first gate structure, at least one first spacer, at least one source drain structure, at least one conductive plug, and at least one protection layer. The first gate structure is present on the substrate. The first spacer is present on at least one sidewall of the first gate structure. The source drain structure is present adjacent to the first spacer. The conductive plug is electrically connected to the source drain structure. The protection layer is present between the conductive plug and the spacer.

20 Claims, 3 Drawing Sheets

(56) References Cited

U.S. PATENT DOCUMENTS

| | | |
|---|---|---|
| 2002/0190316 A1 | 12/2002 | Kwean et al. |
| 2004/0106267 A1 | 6/2004 | Beyer et al. |
| 2013/0295756 A1 | 11/2013 | Yuan et al. |
| 2013/0309856 A1* | 11/2013 | Jagannathan ......... H01L 29/785 438/587 |
| 2014/0339629 A1 | 11/2014 | Xie et al. |
| 2014/0367825 A1 | 12/2014 | Kim et al. |
| 2015/0076619 A1 | 3/2015 | Adachi et al. |
| 2015/0255609 A1 | 9/2015 | Zhu et al. |
| 2015/0332962 A1 | 11/2015 | Chen et al. |
| 2016/0372380 A1 | 12/2016 | Pranatharthiharan et al. |
| 2016/0379873 A1 | 12/2016 | Bu et al. |
| 2017/0053804 A1 | 2/2017 | Lu et al. |

* cited by examiner

SEMICONDUCTOR STRUCTURE AND MANUFACTURING METHOD THEREOF

PRIORITY CLAIM AND CROSS-REFERENCE

This application is a continuation of U.S. patent application Ser. No. 16/049,902, filed on Jul. 31, 2018, entitled, "Semiconductor Structure and Manufacturing Method Thereof", which is a divisional of U.S. patent application Ser. No. 15/048,942, filed on Feb. 19, 2016, now U.S. Pat. No. 10,163,649, entitled, "Semiconductor Structure and Manufacturing Method Thereof", which claims the benefit of U.S. Provisional Application No. 62/269,025, filed on Dec. 17, 2015, which applications are hereby incorporated herein by reference in their entireties.

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area.

The word "interconnection" in integrated circuits means conductive lines which connect the various electronic components. The interconnecting conductive lines are separated from the substrate by insulating layers, except on the contact area. As feature densities increase, the widths of the conductive lines and the spacing between the conductive lines of interconnect structures also scale smaller.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
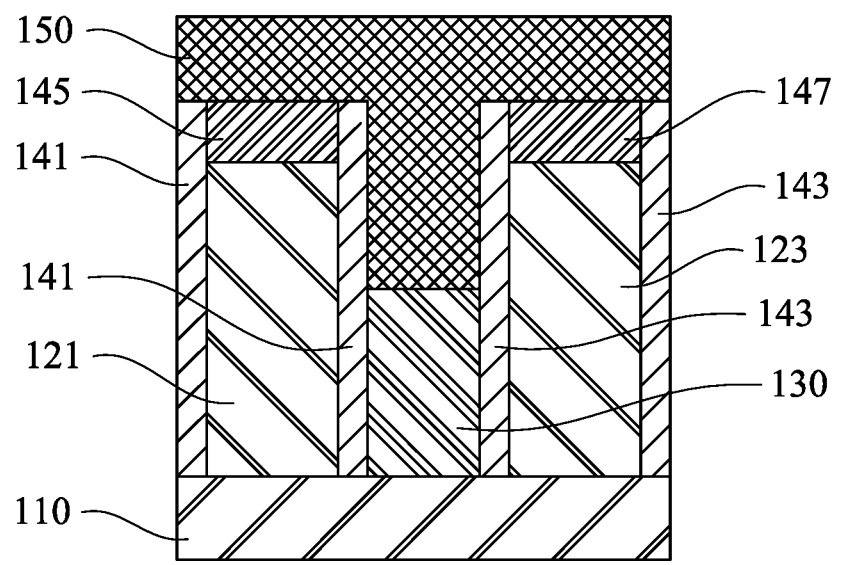
FIGS. 1-6 are cross-sectional views of a method for manufacturing a semiconductor structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by the person having ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1-6 are cross-sectional views of a method for manufacturing a semiconductor structure at various stages in accordance with some embodiments of the present disclosure.

Reference is made to FIG. 1. A semiconductor structure is formed. The semiconductor structure includes a substrate 110, gate structures 121 and 123, and at least one source drain structure 130. The gate structures 121 and 123 are respectively present on the substrate 110. The source drain structure 130 is present on the substrate 110 and adjacent to the gate structures 121 and 123. In other words, the source drain structure 130 is present between the gate structures 121 and 123. It is note that the numbers of the gate structures 121 and 123 and the number of the source drain structure 130 are illustrative and should not limit various embodiments of the present disclosure. A person having ordinary skill in the art may select suitable numbers for the gate structures 121 and 123 and the source drain structure 130 according to actual situations.

In some embodiments, the substrate 110 may be made of a semiconductor material and may include, for example, a graded layer or a buried oxide therein. In some embodiments, the substrate 110 includes bulk silicon that may be undoped or doped (e.g., p-type, n-type, or combinations thereof). Other materials that are suitable for semiconductor device formation may be used. For example, germanium, quartz, sapphire, and glass could alternatively be used for the substrate 110. Alternatively, the substrate 110 may be an active layer of a semiconductor-on-insulator (SOI) substrate or a multi-layered structure, such as a silicon-germanium layer formed on a bulk silicon layer.

In some embodiments, at least one stack of a gate dielectric layer, a diffusion barrier layer, a metal layer, a block layer, a wetting layer, and filling metal form at least one of the gate structures 121 and 123. In other words, at least one of the gate structures 121 and 123 may include the stack of the gate dielectric layer, the diffusion barrier layer, the metal layer, the block layer, the wetting layer, and the filling metal.

In some embodiments, the gate dielectric layer includes an interfacial layer (IL, the lower part of the gate dielectric layer), which is a dielectric layer. In some embodiments, the IL includes an oxide layer, such as a silicon oxide layer, which may be formed through a thermal oxidation of the substrate 110, a chemical oxidation, or a deposition step. The gate dielectric layer may also include a high-k dielectric layer (the upper part of the gate dielectric layer) including a high-k dielectric material, such as hafnium oxide, lanthanum oxide, aluminum oxide, or combinations thereof. The dielectric constant (k-value) of the high-k dielectric material is higher than about 3.9, and may be higher than about 7, and sometimes as high as about 21 or higher. The high-k dielectric layer is overlying, and may contact, the IL.

In some embodiments, the diffusion barrier layer includes TiN, TaN, or combinations thereof. For example, the diffusion barrier layer may include a TiN layer (the lower part of the diffusion barrier layer) and a TaN layer (the upper part of the diffusion barrier layer) over the TiN layer.

When one of the gate structures 121 and 123 forms an n-type metal-oxide-semiconductor (MOS) device, the metal layer is in contact with the diffusion barrier layer. For example, in the embodiments in which the diffusion barrier layer includes a TiN layer and a TaN layer, the metal layer may be in physical contact with the TaN layer. In alternative embodiments in which one of the gate structures 121 and 123 forms a p-type MOS device, an additional TiN layer is formed between, and in contact with, the TaN layer (in the diffusion barrier layer) and the overlaying metal layer. The additional TiN layer provides the work function suitable for the pMOS device, which work function is higher than the mid-gap work function (about 4.5 eV) that is in the middle of the valance band and the conduction band of silicon. The work function higher than the mid-gap work function is referred to as a p-work function, and the respective metal having the p-work function is referred to as a p-metal.

The metal layer provides the work function suitable for the nMOS device, which work function is lower than the mid-gap work function. The work function lower than the mid-gap work function is referred to as an n-work function, and the respective metal having the n-work function may be referred to as an n-metal. In some embodiments, the metal layer is an n-metal having a work function lower than about 4.3 eV. The work function of the metal layer may also be in a range from about 3.8 eV to about 4.6 eV. The metal layer may include titanium aluminum (TiAl) (which may include, or free from or substantially free from other elements) in accordance with some embodiments. The formation of the metal layer may be achieved through physical vapor deposition (PVD). In accordance with some embodiments of the present disclosure, the metal layer is formed at room temperature (for example, from about 20° C. to about 25° C.). In alternative embodiments, the metal layer is formed at an elevated temperature higher than the room temperature, for example, higher than about 200° C.

The block layer may include TiN in some embodiments. The block layer may be formed using atomic layer deposition (ALD).

The wetting layer has an ability to adhere (and wet) the subsequently formed filling metal during the reflow of the filling metal. In some embodiments, the wetting layer is a cobalt layer, which may be formed using atomic layer deposition (ALD) or chemical vapor deposition (CVD).

The filling metal may include aluminum, an aluminum alloy (e.g., titanium aluminum), tungsten, or copper, which may also be formed using physical vapor deposition (PVD), chemical vapor deposition (CVD), or the like. The filling metal may be reflowed. The formation of the wetting layer improves the wetting of the filling metal to the underlying layers.

The source drain structure 130 may be formed by doping impurities into at least one active semiconductor fin, which is formed by, for example, patterning and etching the substrate 110 using photolithography techniques. In some embodiments that the resulting MOS device is an nMOS device, n-type impurities such as phosphorous or arsenic may be doped in the source drain structure 130. In some other embodiments that the resulting MOS device is a pMOS device, p-type impurities such as boron or $BF_2$ may be doped in the source drain structure 130.

Alternatively, the source drain structure 130 may be formed by, for example, epitaxial growth. In these embodiments, the source drain structure 130 may function as a source drain stressor to enhance carrier mobility of the semiconductor device and the device performance. The source drain structure 130 may be formed using a cyclic deposition and etching (CDE) process. The CDE process includes an epitaxial deposition/partial etch process and repeating the epitaxial deposition/partial etch process at least once.

In some embodiments that the resulting MOS device is an nMOS device, the source drain structure 130 may be an n-type epitaxy structure. In some embodiments that the resulting MOS device is a pMOS device, the source drain structure 130 may be a p-type epitaxy structure. The n-type epitaxy structure may be made of SiP, SiC, SiPC, Si, III-V compound semiconductor materials or combinations thereof, and the p-type epitaxy structure may be made of SiGe, SiGeC, Ge, Si, III-V compound semiconductor materials, or combinations thereof. During the formation of the n-type epitaxy structure, n-type impurities such as phosphorous or arsenic may be doped with the proceeding of the epitaxy. For example, when the n-type epitaxy structure includes SiP or SiC, n-type impurities are doped. Moreover, during the formation of the p-type epitaxy structure, p-type impurities such as boron or $BF_2$ may be doped with the proceeding of the epitaxy. For example, when the p-type epitaxy structure includes SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The source drain structure 130 may be in-situ doped. If the source drain structure 130 are not in-situ doped, a second implantation process (i.e., a junction implant process) is performed to dope the source drain structure 130. One or more annealing processes may be performed to activate the source drain structure 130. The annealing processes include rapid thermal annealing (RTA) and/or laser annealing processes.

In addition, spacers 141 are present on sidewalls of the gate structure 121, and spacers 143 are present on sidewalls of the gate structure 123. In some embodiments, at least one of the spacers 140 and 143 include one or more layers, including silicon nitride, silicon oxynitride, silicon oxide, or other dielectric materials. The available formation methods include plasma enhanced chemical vapor deposition (PECVD), low-pressure chemical vapor deposition (LPCVD), sub-atmospheric chemical vapor deposition (SACVD), and other deposition methods.

Moreover, a hard mask layer 145 is present on a top surface of the gate structure 121, and a hard mask layer 147 is present on a top surface of the gate structure 123. The hard mask layer 145 and 147 may include, for example, silicon nitride or the like. The hard mask layer 145 and 147 may be formed using chemical vapor deposition (CVD), physical vapor deposition (PVD), atomic layer deposition (ALD), other suitable processes, or combinations thereof.

Then, a dielectric layer 150 is formed on the gate structures 121 and 123 and the source drain structure 130. The dielectric layer 150 is an interlayer dielectric (ILD) layer. The dielectric layer 150 is made of a dielectric material, such as silicon oxide, silicon nitride, silicon oxynitride, or combinations thereof. In some embodiments, the dielectric layer 150 is made of a low-κ dielectric material to improve resistive-capacitive (RC) delay. The dielectric constant of the low-κ dielectric material is lower than that of silicon dioxide ($SiO_2$). One approach to reduce the dielectric constant of a dielectric material is to introduce carbon (C) or fluorine (F) atoms. For example, in $SiO_2$ (κ=3.9), the introduction of C atoms to form hydrogenated carbon-doped silicon oxide (SiCOH) (κ is between 2.7 and 3.3) and the introduction of F atoms to form fluorosilicate glass (FSG) (κ is between 3.5 and 3.9) reduces its dielectric constant. In some embodiments, the low-κ dielectric material is, for example, nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof. The dielectric layer 150 is formed by, for example, chemical vapor deposition (CVD), spin coating, or combinations thereof.

Figure 2:
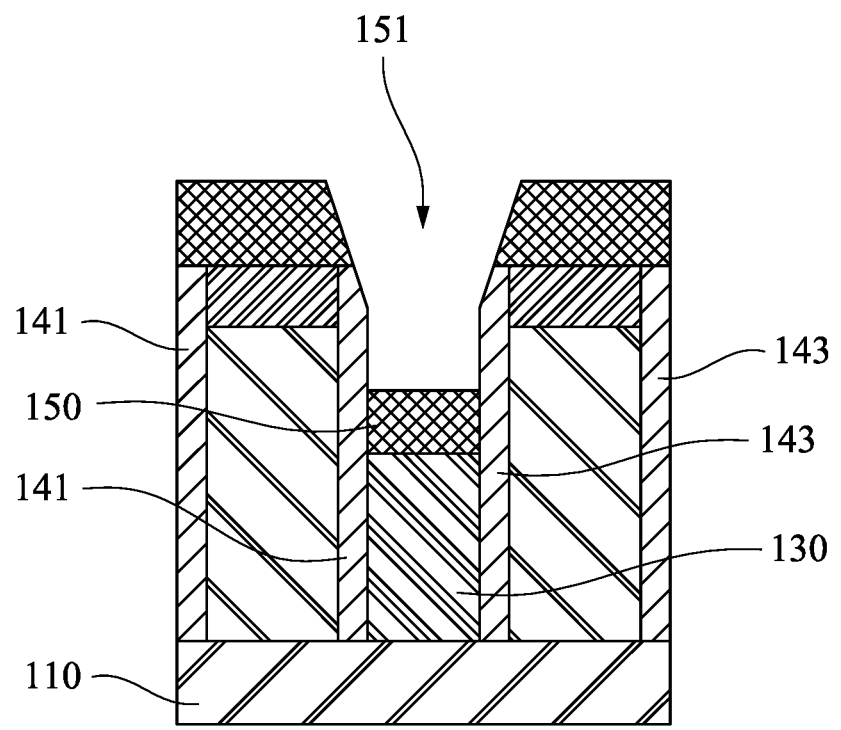

Reference is made to FIG. 2. A recess 151 is formed at least partially in the dielectric layer 150 to expose at least a portion of at least one of the spacers 141 and 143, while a portion of the dielectric layer 150 is left on the source drain structure 130, in which the portion of the dielectric layer 150 on the source drain structure 130 is present adjacent to the spacers 141 and 143 and between the spacers 141 and 143. The recess 151 is formed by a photolithography and etching process. The photolithography and etching process includes photoresist application, exposure, developing, etching, and photoresist removal. A photoresist is applied onto the dielectric layer 150 by, for example, spin coating. The photoresist is then prebaked to drive off excess photoresist solvent. After prebaking, the photoresist is exposed to a pattern of intense light.

The intense light is, for example, a G-line with a wavelength of about 436 nm, an I-line with a wavelength of about 365 nm, a krypton fluoride (KrF) excimer laser with a wavelength of about 248 nm, an argon fluoride (ArF) excimer laser with a wavelength of about 193 nm, a fluoride ($F_2$) excimer laser with a wavelength of about 157 nm, or combinations thereof. A space between the final lens of the exposure tool and the photoresist surface may be filled with a liquid medium that has a refractive index greater than one during the exposure to enhance the photolithography resolution. The exposure to light causes a chemical change that allows some of the photoresist soluble in a photographic developer.

Then, a post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist.

At least one portion of the dielectric layer 150 which is not protected by the remaining photoresist is etched to form the recess 151. The etching of the dielectric layer 150 may be dry etching, such as reactive ion etching (RIE), plasma enhanced (PE) etching, or inductively coupled plasma (ICP) etching. In some embodiments, when the dielectric layer 150 is made of silicon oxide, fluorine-based RIE can be used to form the recess 151. The gas etchant used to dry etch the dielectric layer 150 is, for example, $CF_4/O_2$.

After the recess 151 is formed, the photoresist is removed from the dielectric layer 150 by, for example, plasma ashing, stripping, or combinations thereof. Plasma ashing uses a plasma source to generate a monatomic reactive species, such as oxygen or fluorine. The reactive species combines with the photoresist to form ash which is removed with a vacuum pump. Stripping uses a photoresist stripper, such as acetone or a phenol solvent, to remove the photoresist from the dielectric layer 150.

Figure 3:
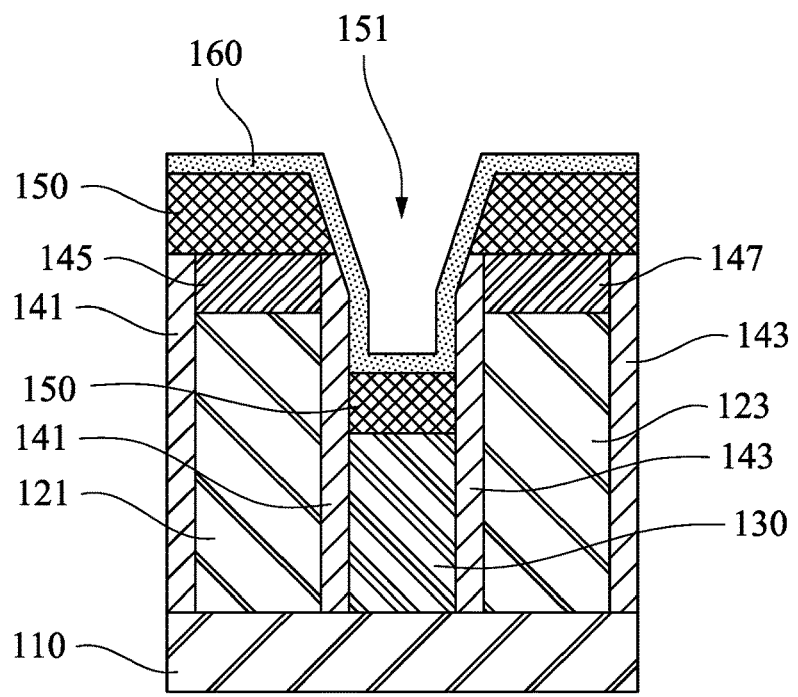

Reference is made to FIG. 3. A protection layer 160 is formed on a top surface of the dielectric layer 150 on or above the gate structures 121 and 123 (or, on or above the hard mask layers 145 and 147), at least one sidewall of the recess 151 (i.e., at least one sidewall of the dielectric layer 150 on or above the gate structures 121 and 123 and at least a portion of the exposed spacers 141 and 143), and a bottom surface of the recess 151 (i.e., a top surface of the dielectric layer 150 on the source drain structure 130). The protection layer 160 may include, for example, silicon nitride, silicon oxynitride, or the like. The protection layer 160 may be formed using atomic layer deposition (ALD), other suitable processes, or combinations thereof.

Figure 4:
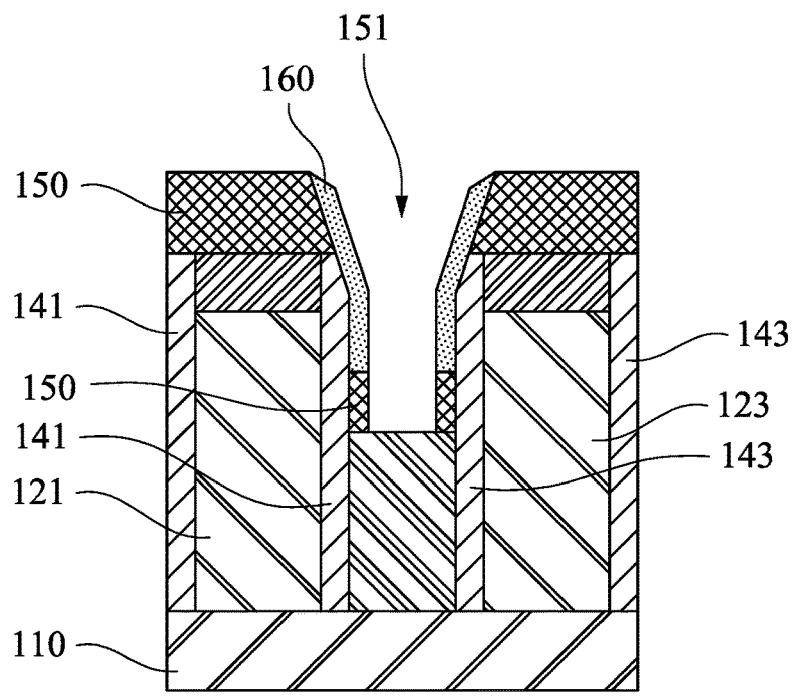

As shown in FIG. 3 and FIG. 4, an anisotropic etching is performed to remove at least portions of the protection layer 160 on the top surface of the dielectric layer 150 on or above the gate structures 121 and 123 and on the bottom surface of the recess 151 (i.e., on the top surface of the dielectric layer 150 on the source drain structure 130) and a portion of the dielectric layer 150 on the source drain structure 130, while the residual protection layer 160 and a portion of the residual dielectric layer 150 still cover the sidewalls of the recess 151 (i.e., the sidewalls of the dielectric layer 150 on or above the gate structures 121 and 123 and the spacers 141 and 143). Therefore, the recess 151 is deepened, and the source drain structure 130 is exposed by the deepened recess 151. In some embodiments, the anisotropic etching may be dry etching, such as reactive ion etching (RIE), plasma enhanced (PE) etching, or inductively coupled plasma (ICP) etching.

Figure 5:
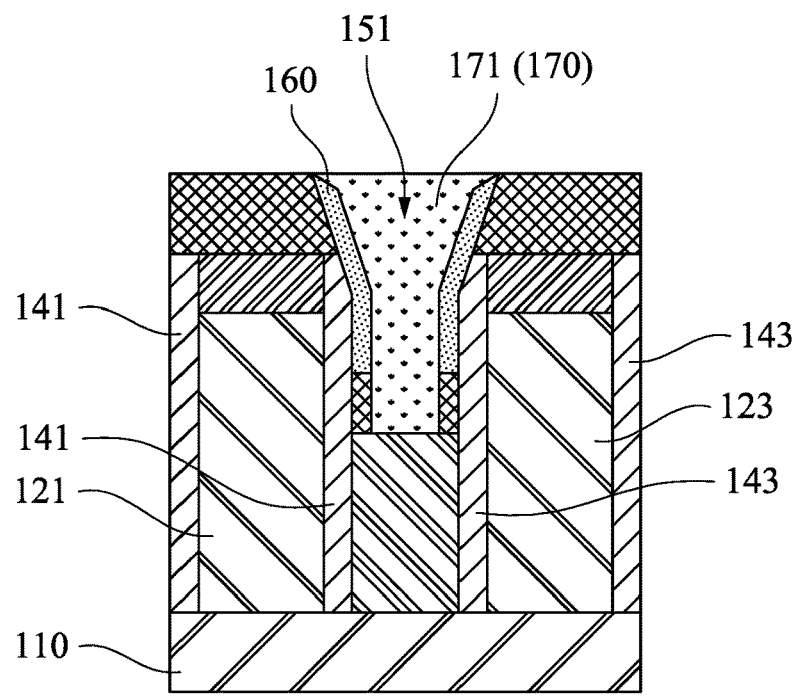

In FIG. 5, a conductive layer 170 overfills the recess 151, and then the excess conductive layer 170 outside of the recess 151 is removed. The conductive layer 170 is made of metal, such as copper (Cu), aluminum (Al), tungsten (W), nickel (Ni), cobalt (Co), titanium (Ti), platinum (Pt), tantalum (Ta), or combinations thereof. The conductive layer 170 is formed by, for example, electrochemical deposition, physical vapor deposition (PVD), chemical vapor deposition (CVD), or combinations thereof.

The excess conductive layer 170 outside of the recess 151 is removed through a removal process. In some embodiments, the conductive layer 170 over burden is removed by a chemical mechanical polishing (CMP) process. In some embodiments, when the conductive layer 170 is made of copper (Cu), the CMP slurry is made of, for example, a mixture of suspended abrasive particles, an oxidizer, and a corrosion inhibitor, and the CMP slurry is acidic. After the CMP process, a conductive plug 171 (the conductive layer 170) is formed in the recess 151. The conductive plug 171 is electrically connected to the source drain structure 130, and the protection layer 160 is present between the conductive plug 171 and the spacer 141 and between the conductive plug 171 and the spacer 143.

Figure 6:
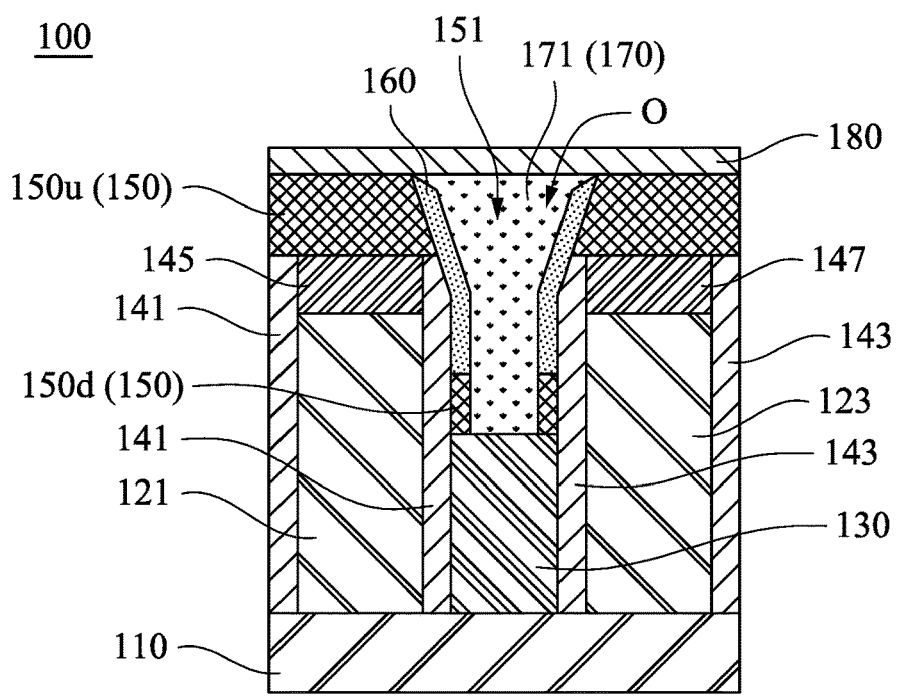

Reference is made to FIG. 6. At least one stop layer 180 is formed on the dielectric layer 150 on or above the gate structures 121 and 123 and the conductive plug 171, such that the dielectric layer 150 on or above the gate structures 121 and 123 and the conductive plug 171 is covered by the stop layer 180. The stop layer 180 may include, for example, silicon oxynitride, silicon carbide, silicon carbon oxynitride, silicon nitride, or carbon-doped silicon nitride, or the like. The stop layer 180 may be formed using chemical vapor deposition (CVD), physical vapor deposition (PVD), atomic layer deposition (ALD), other suitable processes, or combinations thereof.

In another aspect of the present disclosure, a semiconductor structure 100 is provided. The semiconductor structure 100 includes a substrate 110, gate structures 121 and 123, spacers 141 and 143, at least one source drain structure 130, at least one conductive plug 171, and at least one protection layer 160. The gate structures 121 and 123 are present on the substrate 110. The spacer 141 is present on at least one sidewall of the gate structure 121, and the spacer 143 is present on at least one sidewall of the gate structure 123. The source drain structure 130 is present on the substrate 110 and adjacent to the spacers 141 and 143, and the source drain structure 130 is present between the spacers 141 and 143. The conductive plug 171 is electrically connected to the source drain structure 130. The protection layer 160 is present between the conductive plug 171 and the spacer 141 and between the conductive plug 171 and the spacer 143.

Specifically, the protection layer 160 is made of a dielectric material, such as silicon nitride, silicon oxynitride, or combinations thereof. Embodiments of this disclosure are not limited thereto. The person having ordinary skill in the art can make proper modifications to the protection layer 160 depending on the actual application.

The semiconductor structure 100 further includes a dielectric layer 150u. The dielectric layer 150u is present at least on one of the gate structures 121 and 123 and has an opening O at least therein. The source drain structure 130 is exposed through the opening O, and at least a portion of the conductive plug 171 is present in the opening O. The conductive plug 171 is electrically connected to the source drain structure 130 at least through the opening O. The protection layer 160 is further present between the conductive plug 171 and at least one sidewall of the opening O (i.e., at least one sidewall of the dielectric layer 150u).

The semiconductor structure 100 further includes a dielectric layer 150d. The dielectric layer 150d is present between the conductive plug 171 and the spacer 141 and between the conductive plug 171 and the spacer 143. The protection layer 160 is present above the dielectric layer 150d. That is, the dielectric layer 150d is present between the protection layer 160 and the source drain structure 130.

The semiconductor structure 100 further includes a hard mask layer 145 present on a top surface of the gate structure 121 and a hard mask layer 147 present on a top surface of the gate structure 123. In other words, the hard mask layer 145 is present between the gate structure 121 and the dielectric layer 150u, and the hard mask layer 147 is present between the gate structure 123 and the dielectric layer 150u.

The source drain structure 130 may include at least one source drain stressor. Embodiments of this disclosure are not limited thereto. The person having ordinary skill in the art can make proper modifications to the source drain structure 130 depending on the actual application.

The protection layer 160 can protect the spacers 141 and 143 from being over-etched during the deepening the recess 151. Therefore, after formation of the conductive plug 171, the conductive plug 171 can be electrically isolated from the gate structures 121 and 123 without causing short circuit failures and/or the leakage problem. With the protection layer 160, the device size can be further reduced without putting a heavy load on the photolithography and etching process, and thus the device performance can be improved. Furthermore, the overlay and pattern loading requirements can be loosened. In addition, the protection layer 160 can enlarge the process window for contact hole formation and improve in-line control in the semiconductor device fabrication process. Therefore, the reliability and/or the yield in fabricating the semiconductor devices can be improved.

According to some embodiments of the present disclosure, a semiconductor structure includes a substrate, at least one first gate structure, at least one first spacer, at least one source drain structure, at least one conductive plug, and at least one protection layer. The first gate structure is present on the substrate. The first spacer is present on at least one sidewall of the first gate structure. The source drain structure is present adjacent to the first spacer. The conductive plug is electrically connected to the source drain structure. The protection layer is present between the conductive plug and the spacer.

According to some embodiments of the present disclosure, a semiconductor structure includes a substrate, at least one gate structure, at least one source drain structure, at least one first dielectric layer, at least one conductive plug, and at least one protection layer. The gate structure is present on the substrate. The source drain structure is present on the substrate. The first dielectric layer is present at least on the gate structure and has an opening therein, and the source drain structure is exposed through the opening. The conductive plug is electrically connected to the source drain structure at least through the opening. The protection layer is present between the conductive plug and at least one sidewall of the opening.

According to some embodiments of the present disclosure, a method for manufacturing a semiconductor structure includes the following operations. A dielectric layer is formed on at least one gate structure and at least one source drain structure. At least one recess is formed at least partially in the dielectric layer. A protection layer is formed at least on at least one sidewall of the recess. The recess is deepened to expose the source drain structure. A conductive plug is formed in the recess, in which the conductive plug is electrically connected to the source drain structure.

According to some embodiments of the present disclosure, a method includes forming a gate structure over a substrate. A source/drain structure is formed over the substrate and adjacent the gate structure. A dielectric layer is formed over the gate structure and the source/drain structure. A recess is formed in the dielectric layer. A first portion of the dielectric layer is interposed between a bottom of the recess and the source/drain structure. A protection layer is formed on sidewalls and the bottom of the recess. The recess is extended toward the source/drain structure to form an extended recess. The extended recess exposes the source/drain structure. A conductive plug is formed in the extended recess. The conductive plug is electrically connected to the source/drain structure.

According to some embodiments of the present disclosure, a method includes forming a gate structure over a substrate. A hard mask is formed over the gate structure. A spacer is formed on a sidewall of the gate structure and a sidewall of the hard mask. A source/drain structure is formed over the substrate and adjacent the spacer. A first dielectric layer is formed over the source/drain structure and along a sidewall of the spacer. The first dielectric layer is etched to form a recess. The recess exposes the sidewall of the spacer and a portion of the first dielectric layer over the source/drain structure. A second dielectric layer is formed on sidewalls and a bottom of the recess. The second dielectric layer and the portion of the first dielectric layer are etched to extend the recess toward the source/drain structure and to form an extended recess. The extended recess is filled with a conductive material.

According to some embodiments of the present disclosure, a method includes forming a first gate structure over a substrate. A first spacer is formed on a first sidewall of the first gate structure. A source/drain structure is formed over the substrate and adjacent the first spacer. A first dielectric material is deposited over the first gate structure and the source/drain structure. A first portion of the first dielectric material is removed to expose a sidewall of the first spacer. A second portion of the first dielectric material remains over the source/drain structure. A second dielectric material is deposited along the sidewall of the first spacer and over a topmost surface of the second portion of the first dielectric material. The second dielectric material is different from the first dielectric material. A first portion of the second dielectric material is removed to expose the topmost surface of the second portion of the first dielectric material. A second portion of the second dielectric material remains on the sidewall of the first spacer. The second portion of the first dielectric material is patterned using the second portion of the second dielectric material as a mask to expose the source/drain structure. A conductive material is deposited over the source/drain structure and along a sidewall of the second portion of the second dielectric material.

According to some embodiments of the present disclosure, a device includes a substrate, a first gate structure over the substrate, a first spacer extending along a first sidewall of the first gate structure, a source/drain structure over the substrate and adjacent the first spacer, a conductive plug over the source/drain structure, a first insulating layer interposed between the first spacer and the conductive plug, and a second insulating layer interposed between the first spacer and the conductive plug. The first insulating layer is interposed between the second insulating layer and the source/drain structure. The first insulating layer and the second insulating layer include different materials. An interface between the first insulating layer and the second insulating layer is closer to the substrate than a top surface of the first spacer.

According to some embodiments of the present disclosure, a device includes a substrate, a first gate structure and a second gate structure over the substrate, a source/drain structure interposed between the first gate structure and the second gate structure, a first insulating layer over the first gate structure and the second gate structure, a conductive plug extending through the first insulating layer and contacting the source/drain structure, a second insulating layer interposed between the conductive plug and each of the first gate structure and the second gate structure, and a third insulating layer interposed between the conductive plug and the first insulating layer. The first insulating layer includes a first material. A width of the conductive plug decreases as the conductive plug extends through the first insulating layer toward the source/drain structure. The second insulating layer includes the first material. The third insulating layer includes a second material different from the first material. An interface between the second insulating layer and the third insulating layer is closer to the substrate than a top surface of the first gate structure and a top surface of the second gate structure.

According to some embodiments of the present disclosure, a device includes a substrate, a first gate structure and a second gate structure over the substrate, a first spacer extending along a first sidewall of the first gate structure, a second spacer extending along a second sidewall of the second gate structure, a source/drain structure interposed between the first spacer and the second spacer, a first insulating layer over the first gate structure, the second gate structure, the first spacer and the second spacer, a conductive plug extending through the first insulating layer and contacting the source/drain structure, a second insulating layer interposed between the conductive plug and each of the first spacer and the second spacer, and a third insulating layer interposed between the conductive plug and each of the first spacer, the second spacer and the first insulating layer. A top surface of the source/drain structure is below a top surface of the first gate structure and a top surface of the second gate structure. The first insulating layer includes a first material. The second insulating layer includes the first material. The third insulating layer includes a second material different from the first material. An interface between the second insulating layer and the third insulating layer is in physical contact with each of the first spacer and the second spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
  a substrate;
  a first gate structure over the substrate;
  a first spacer extending along a first sidewall of the first gate structure;
  a source/drain structure over the substrate and adjacent the first spacer;
  a conductive plug over the source/drain structure;
  a first insulating layer interposed between the first spacer and the conductive plug; and
  a second insulating layer interposed between the first spacer and the conductive plug, the first insulating layer being interposed between the second insulating layer and the source/drain structure, wherein a first portion of the second insulating layer is above a top surface of the first spacer, wherein the first insulating layer and the second insulating layer comprise different materials, and wherein an interface between the first insulating layer and the second insulating layer is closer to the substrate than the top surface of the first spacer.

2. The device of claim 1, wherein a width of the conductive plug decreases as the conductive plug extends from the top surface of the first spacer toward the source/drain structure.

3. The device of claim 1, further comprising a third insulating layer over the first gate structure, wherein the first insulating layer and the third insulating layer comprise a same material.

4. The device of claim 3, wherein a portion of the second insulating layer is interposed between the third insulating layer and the conductive plug.

5. The device of claim 3, wherein a top surface of the third insulating layer is substantially level with a top surface of the conductive plug.

6. The device of claim 3, wherein the conductive plug has a first width at a top surface of the third insulating layer and a second width at the top surface of the first spacer, and wherein the first width is greater than the second width.

7. The device of claim 1, wherein the first spacer has a sloped sidewall, the sloped sidewall facing the conductive plug.

8. The device of claim 1, wherein the second insulating layer extends along a sidewall of the conductive plug and reaches a top surface of the conductive plug.

9. A device comprising:
a substrate;
a first gate structure and a second gate structure over the substrate;
a source/drain structure interposed between the first gate structure and the second gate structure;
a first insulating layer over the first gate structure and the second gate structure, wherein the first insulating layer comprises a first material;
a conductive plug extending through the first insulating layer and contacting the source/drain structure, wherein a width of the conductive plug decreases as the conductive plug extends through the first insulating layer toward the source/drain structure;
a second insulating layer interposed between the conductive plug and each of the first gate structure and the second gate structure, wherein the second insulating layer comprises the first material; and
a third insulating layer interposed between the conductive plug and the first insulating layer, wherein the third insulating layer comprises a second material different from the first material, and wherein an interface between the second insulating layer and the third insulating layer is closer to the substrate than a top surface of the first gate structure and a top surface of the second gate structure.

10. The device of claim 9, further comprising a first spacer interposed between the first gate structure and the second insulating layer.

11. The device of claim 10, wherein the first spacer is further interposed between the first gate structure and the third insulating layer.

12. The device of claim 10, wherein the first spacer has a sloped sidewall.

13. The device of claim 10, wherein a portion of the third insulating layer is directly above a top surface of the first spacer.

14. The device of claim 9, further comprising a fourth insulating layer over the third insulating layer and the conductive plug.

15. The device of claim 9, wherein the conductive plug has a sloped sidewall.

16. A device comprising:
a substrate;
a first gate structure and a second gate structure over the substrate;
a first spacer extending along a first sidewall of the first gate structure;
a second spacer extending along a second sidewall of the second gate structure;
a source/drain structure interposed between the first spacer and the second spacer, a top surface of the source/drain structure being below a top surface of the first gate structure and a top surface of the second gate structure;
a first insulating layer over the first gate structure, the second gate structure, the first spacer and the second spacer, wherein a width of the first spacer decreases as the first spacer extends from the top surface of the first gate structure toward a bottom surface of the first insulating layer, wherein the first insulating layer comprises a first material;
a conductive plug extending through the first insulating layer and contacting the source/drain structure;
a second insulating layer interposed between the conductive plug and each of the first spacer and the second spacer, wherein the second insulating layer comprises the first material; and
a third insulating layer interposed between the conductive plug and each of the first spacer, the second spacer and the first insulating layer, wherein the third insulating layer comprises a second material different from the first material, and wherein an interface between the second insulating layer and the third insulating layer is in physical contact with each of the first spacer and the second spacer.

17. The device of claim 16, wherein the interface between the second insulating layer and the third insulating layer is in physical contact with the conductive plug.

18. The device of claim 16, wherein the conductive plug has a first width at a top surface of the first insulating layer and a second width at a top surface of the source/drain structure, and wherein the first width is greater than the second width.

19. The device of claim 16, wherein the conductive plug has a sloped sidewall within the first insulating layer.

20. The device of claim 16, wherein the second insulating layer is in physical contact with a top surface of the source/drain structure.

* * * * *